United States Patent [19]
Peters

[11] Patent Number: 5,963,027
[45] Date of Patent: Oct. 5, 1999

[54] PROBE STATION HAVING ENVIRONMENT CONTROL CHAMBERS WITH ORTHOGONALLY FLEXIBLE LATERAL WALL ASSEMBLY

[75] Inventor: Ron A. Peters, Tigard, Oreg.

[73] Assignee: Cascade Microtech, Inc., Beaverton, Oreg.

[21] Appl. No.: 08/870,397

[22] Filed: Jun. 6, 1997

[51] Int. Cl.[6] ............................... G01R 1/04; G01R 1/18; G01R 31/00
[52] U.S. Cl. ........................................ 324/158.1; 324/754
[58] Field of Search ................................. 324/754, 758, 324/765, 158.1

[56] References Cited

U.S. PATENT DOCUMENTS

| | | |
|---|---|---|
| 3,185,927 | 5/1965 | Margulis et al. . |
| 3,333,274 | 7/1967 | Forcier . |
| 3,405,361 | 10/1968 | Kattner et al. . |
| 3,710,251 | 1/1973 | Hagge et al. . |
| 4,115,736 | 9/1978 | Tracy . |
| 4,383,178 | 5/1983 | Shibata et al. . |
| 4,694,245 | 9/1987 | Frommes . |
| 4,731,577 | 3/1988 | Logan . |
| 4,755,746 | 7/1988 | Mallory et al. . |
| 4,757,255 | 7/1988 | Margozzi . |
| 4,758,785 | 7/1988 | Rath . |
| 4,771,234 | 9/1988 | Cook et al. . |
| 4,845,426 | 7/1989 | Nolan et al. . |
| 4,856,904 | 8/1989 | Akagawa . |
| 4,884,026 | 11/1989 | Hayakawa et al. . |
| 5,077,523 | 12/1991 | Blanz . |
| 5,084,671 | 1/1992 | Miyata et al. . |
| 5,220,277 | 6/1993 | Reitinger . |
| 5,266,889 | 11/1993 | Harwood et al. . |
| 5,345,170 | 9/1994 | Schwindt et al. . |
| 5,457,398 | 10/1995 | Schwindt et al. . |

FOREIGN PATENT DOCUMENTS

| | | |
|---|---|---|
| 201205 | 12/1986 | European Pat. Off. . |
| 3114466 | 3/1982 | Germany . |
| 1-209380 | 8/1989 | Japan . |
| 2-022837 | 1/1990 | Japan . |
| 2-220453 | 9/1990 | Japan . |
| 4-000732 | 1/1992 | Japan . |

OTHER PUBLICATIONS

"Model TPO3000 Series Thermochuck® Systems," four–page product note, Temptronic Corporation, Newton, MA (May 1992 or earlier).

"Application Note 1 Controlled Environment Enclosure," two–page application note, Temptronic Corporation, Newton, MA (May 1992 or earlier).

"Cross Section Signature S–1240," one–page sketch prepared by Signatone counsel, Signatone, San Jose, CA (Feb. 1988 or earlier per Signatone).

"S–1240," two–page product note, Signatone, San Jose, CA (Feb. 1988 or earlier per Signatone counsel).

Y. Yamamoto, "A Compact Self–Shielding Prober . . . ," IEEE Trans., Inst. and Meas., vol. 38, pp. 1088–1093, Dec. 1989.

Temptronic's "Guarded" Chuck, one–page note describing guarding system of Temptronic Corporation of Newton, MA, dated Nov. 15, 1989.

Beck & Tomann, "Chip Tester," IBM Technical Disclosure Bulletin, p. 4819 (Jan. 1985).

(List continued on next page.)

*Primary Examiner*—Glenn W. Brown
*Attorney, Agent, or Firm*—Chernoff, Vilhauer, McClung & Stenzel

[57] ABSTRACT

A probe station for probing a test device has a chuck assembly substantially enclosed by an environment control enclosure and laterally movable relative to such enclosure. The environment control enclosure includes a flexible wall assembly interconnected with the chuck assembly to enable such lateral movement thereof along mutually perpendicular directions while maintaining the integrity of the enclosure. The flexible wall assembly has flexible pleats formed therein extending along respective different lateral directions to enable such lateral movement.

15 Claims, 3 Drawing Sheets

OTHER PUBLICATIONS

William Knauer, "Fixturing for Low–Current/Low Voltage Parametric Testing," Evaluation Engineering, (Nov. 1990) pp. 150–153.

Hewlett–Packard, "Application Note 356–HP 4142B Modular DC Source/Monitor Practical Applications," (Nov. 1987) pp. 1–4.

Hewlett–Packard, H–P Model 4284A Precision LCR Meter, Operation Manual (Dec. 1991) pp. 2–1, 6–9 and 6–15.

Cascade Microtech, Advanced On–Wafer Device Characterization Using the Summit 10500, (Dec. 1992).

Micromanipulator Company, Inc., "Test Station Accessories," 1983. (Month unavailable).

Micromanipulator Company, Inc., "Model 8000 Test Station," 1986. (Month unavailable).

Micromanipulator Company, Inc., "Model 8000 Test Station," 1988. (Month unavailable).

Micromanipulator Company, Inc., "Probing Stations and Accessories," 1995, pp. 1–12. (month unavailable).

Photgraph of Micromanipulator Probe Station, 1994. (month unavailable).

5,963,027

PROBE STATION HAVING ENVIRONMENT CONTROL CHAMBERS WITH ORTHOGONALLY FLEXIBLE LATERAL WALL ASSEMBLY

BACKGROUND OF THE INVENTION

The present invention relates to probe stations, commonly known as package or wafer probers, used manually, semi-automatically or fully automatically to test semiconductor devices. More particularly, the invention relates to such probe stations having environment control enclosures for providing dry, EMI shielded, and/or light-tight environments for such test devices, such as those probe stations shown in commonly-owned U.S. Pat. No. 5,266,889 and 5,457,398 which are hereby incorporated by reference.

The probe stations shown in the foregoing patents enable lateral movement of the chuck assembly, which supports the test device, relative to the environment control enclosure along orthogonal X and Y lateral axes to properly position the test devices for probing. To enable such movement of the chuck assembly while simultaneously maintaining the integrity of the environment control enclosure, sliding metal plates are provided on the bottom of the environment control enclosure to allow the full X-Y range of motion. These sliding plates work well in a manual or a semiautomatic application. However, for a fully automatic application, movement speeds are much faster and operation approaches twenty-four hours per day, three hundred and sixty-five days per year. Accordingly, a structure having less friction, inertia, and wear than the sliding plates, and adapted for quicker movements, is desirable. Such structure is needed especially for fully automatic applications, but would also be desirable for manual and semiautomatic applications.

BRIEF SUMMARY OF THE INVENTION

The present invention satisfies the foregoing need by providing a probe station, having a chuck assembly laterally movable with respect to a surrounding environment control enclosure, wherein the environment control enclosure includes a flexible wall assembly interconnected with the chuck assembly to accommodate large lateral X-Y movements.

The wall elements are preferably bendably flexible but, as used herein, "flexible" and "flexibly" are also intended to encompass other types of flexibility such as the provision of articulated or hinged joints between adjacent portions of the wall element material.

The foregoing and other objectives, features, and advantages of the invention will be more readily understood upon consideration of the following detailed description, taken in conjunction with the accompanying drawings.

DETAILED DESCRIPTION OF THE PREFERRED EMBODIMENT

Figure 1:
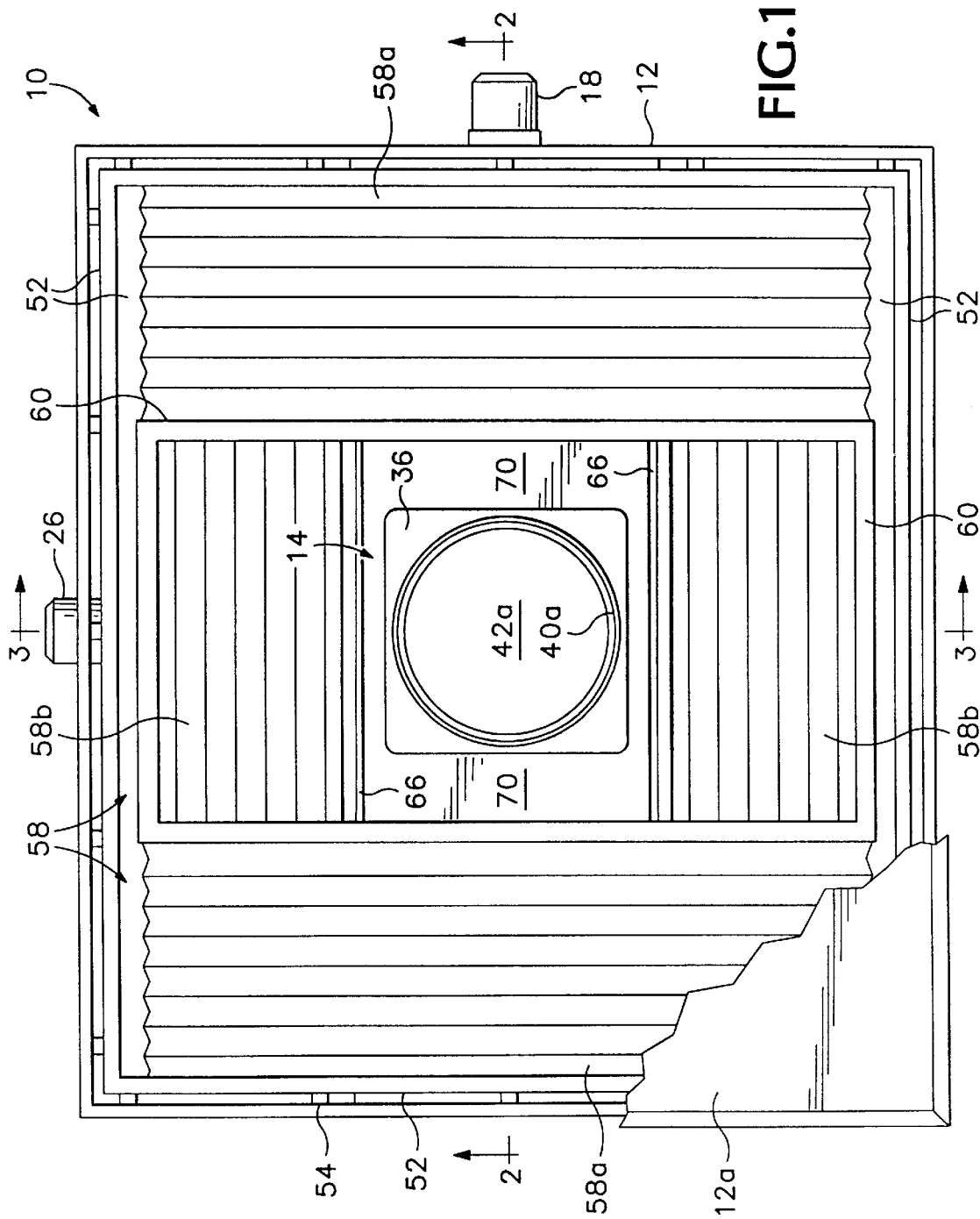
FIG. 1 is a top view of an exemplary probe station in accordance with the present invention, with the top of the station partially removed to show interior structure.

An exemplary embodiment of a probe station in accordance with the present invention, indicated generally as 10 in the figures, has an electrically conductive outer enclosure 12 including a conductive raisable hinged lid 12a electrically connected thereto. A chuck assembly 14 for supporting a test device is laterally positionable by a chuck positioner assembly having orthogonally arranged lateral X-axis and Y-axis positioners. A lateral X-axis positioner 16 has a laterally extending positioning screw (not shown) driven by an electric motor 18. The X-axis positioner 16 is partially enclosed by a conductive housing 16a, and optionally also by flexible pleated rubber boots 16b for accommodating positioning movements while preventing the entry and escape of dirt particles. The conductive housing 16a is insulated from the outer enclosure 12 by respective dielectric anodized coatings on both the exterior of the housing 16a and the interior of the enclosure 12, and is indirectly connected electrically to AC earth ground by means of conventional motor cabling and a grounded motor power supply (not shown), represented schematically in FIG. 2 by a high-impedance electrical path 22. The X-axis positioner 16 selectively moves a Y-axis positioner 24, oriented perpendicularly to the X-axis positioner 16, along the X-axis.

Figure 3:
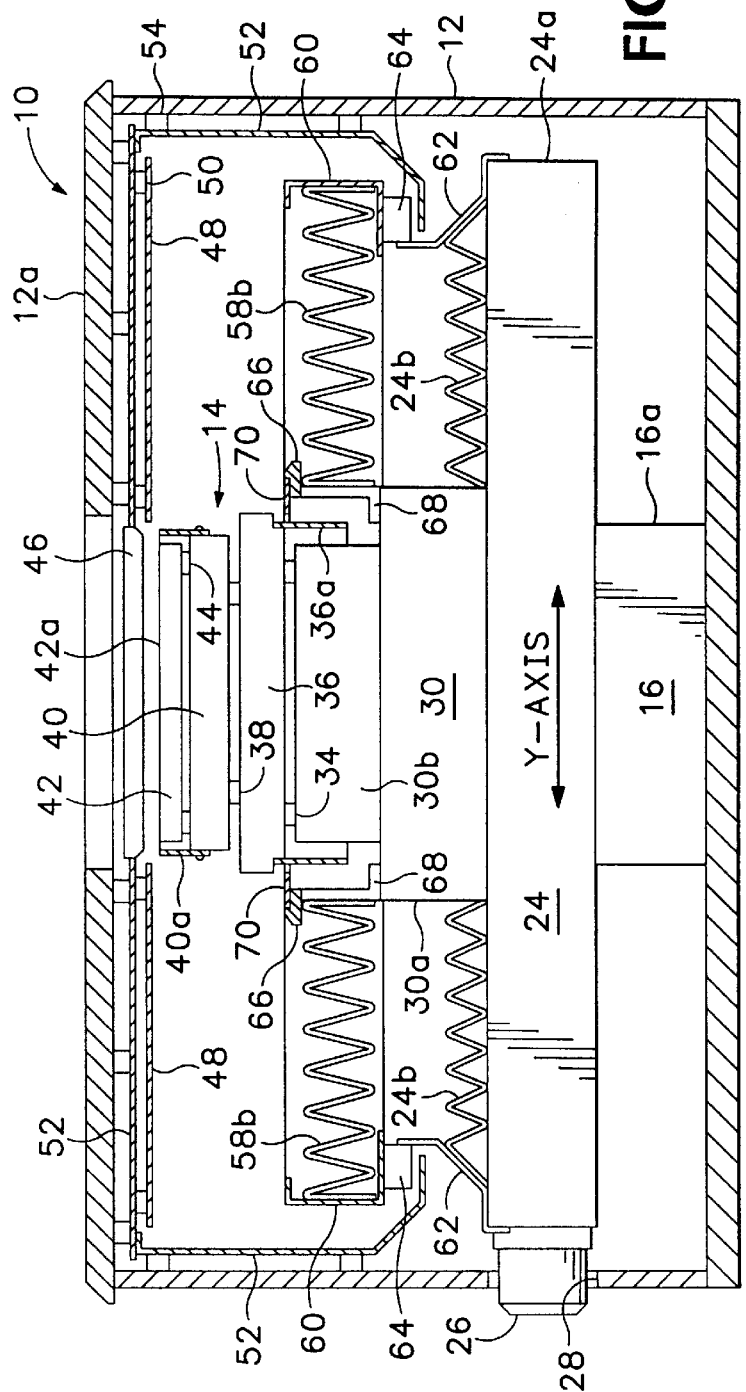
FIG. 3 is a partially sectional, partially schematic view taken along line 3—3 of FIG. 1.

The lateral Y-axis positioner 24 is constructed similarly to the X-axis positioner 16, and includes an outer conductive housing 24a with optional flexible pleated rubber boots 24b. The conductive housing 24a is electrically connected to the housing 16a of the X-axis positioner. The motor 26 of the Y-axis positioner 24 extends through a horizontal slot 28 (FIG. 3) in the side of the enclosure 12, thereby permitting it to be moved freely along the X-axis by the X-axis positioner 16. Alternatively, a larger enclosure 12 could eliminate the slot 28.

A conventional Z-axis positioner 30, having a conductive housing 30a electrically connected to the housing 24a, is movable along the Y-axis by the Y-axis positioner 24. The Z-axis positioner 30 includes respective internal electric motors (not shown) which selectively reciprocate a plunger assembly 30b vertically and rotate it through a limited range about a vertical axis in a known manner.

The outer conductive enclosure 12 is connected by a low-impedance path 32 (FIG. 2) directly to AC ground. Collectively, the outer enclosure 12, 12a and the positioner housings 16a, 24a, and 30a cooperate to provide an electrically conductive outer shield enclosure which separates the remainder of the probe station from environmental noise sources, whether located externally of the enclosure 12 or internally thereof inside the positioner housings. Such noise sources include the electric motors 18 and 26, and those motors within the Z-axis positioner 30, as well as other electrical components such as cables, thermal heaters, encoders, switches, sensors, etc.

Mounted atop the plunger assembly 30b and electrically insulated therefrom by dielectric spacers 34 is a square-shaped conductive chuck shield 36 having a downwardly depending conductive cylindrical skirt 36a. Mounted atop the chuck shield 36 and electrically insulated therefrom by dielectric spacers 38 is a conductive chuck guard element 40, which includes a peripheral cylindrical conductive guard skirt 40a. The guard skirt 40a peripherally surrounds a conductive chuck element 42 in spaced relation thereto. The chuck element 42 is insulated from the guard element 40 and guard skirt 40a by dielectric spacers 44 and has a supporting surface 42a thereon for supporting a test device during probing. Probes (not shown) are mounted on a probe ring 46, or other suitable type of probe holder, for contacting the test device when the Z-axis positioner 30 raises the supporting surface 42a upwardly into probing position.

Figure 2:
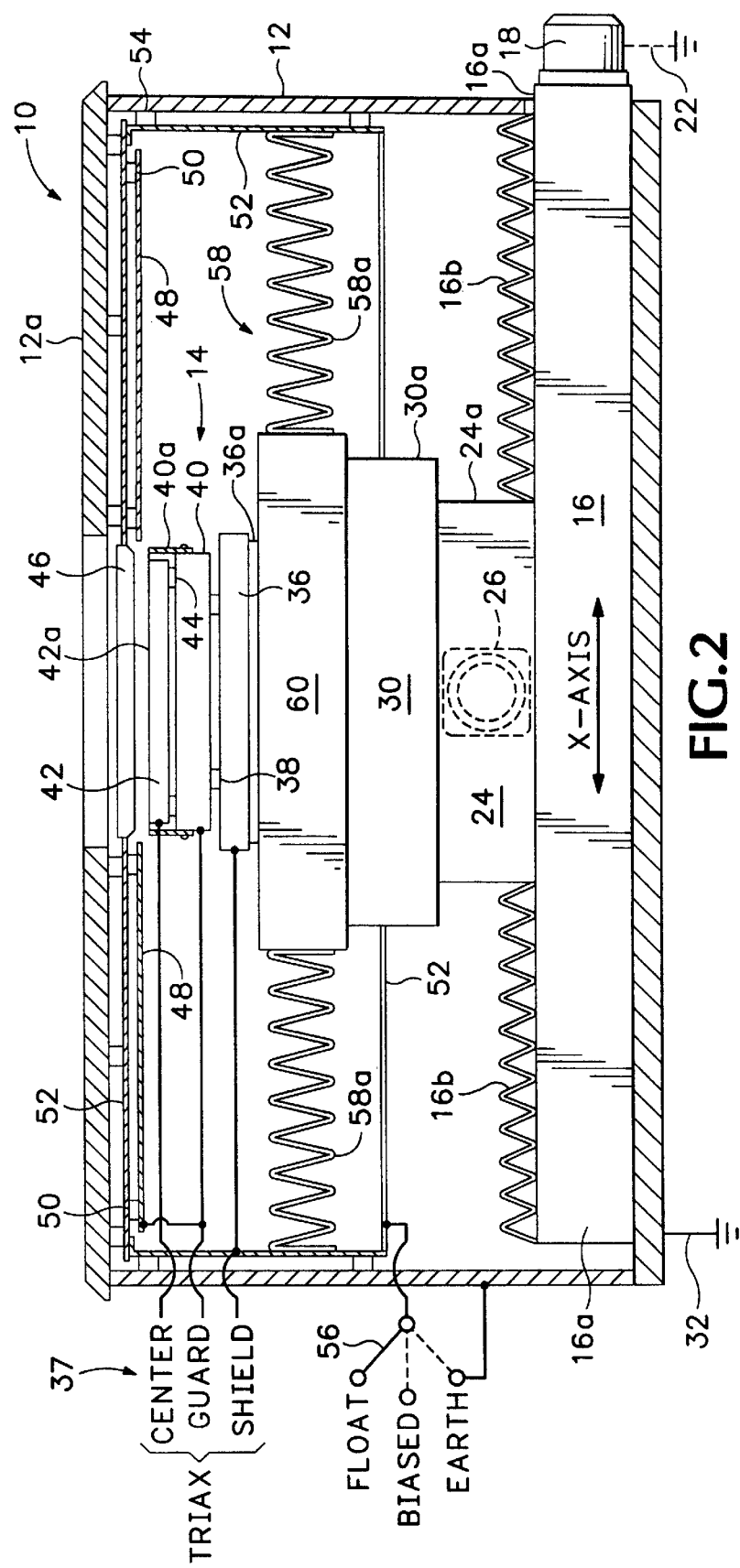
FIG. 2 is a partially sectional, partially schematic view taken along line 2—2 of FIG. 1.

As shown schematically in FIG. 2, the chuck shield 36 is electrically connected to the shield of a triaxial cable 37 interconnected with the measurement instrumentation. The guard element 40, together with the guard skirt 40a, is connected to the guard conductor of the triaxial cable, and the chuck element 42 is connected to the center or signal conductor of the triaxial cable 37. Preferably a further guard element in the form of a conductive plate 48, also electrically connected to the guard conductor of the triaxial cable and insulated from the remainder of the probe station by dielectric spacers 50, is suspended in opposed relationship to the supporting surface 42a. The conductive plate 48 also provides a connection to a guard element on the bottom of a probe card (not shown). Further details of the electrical connections, and of the dielectric spacers utilized to insulate the chuck elements from each other, are explained in U.S. Pat. No. 5,457,398 which is incorporated herein by reference. As explained in such patent, the connections to the chuck elements 40 and 42 cause such elements to have substantially equal potentials to minimize leakage currents therebetween.

An electrically conductive inner shield enclosure 52, which also preferably acts as the probe station's environment control enclosure not only for purposes of EMI shielding but also for purposes of maintaining a dry and/or dark environment, is mounted by dielectric spacers 54 to the interior of the outer enclosure 12 so as to be interposed between and insulated from the outer enclosure 12 and the chuck elements 40 and 42. Like the chuck shield 36, the enclosure 52 is connected to the shield of the triaxial cable 37 associated with the measurement instrumentation. A selective connector mechanism, schematically illustrated as a three-way switch 56 in FIG. 2, enables respective different potentials to be selectively established on the enclosure 52. Normally the selective mechanism 56 would be in the "float" position whereby the potential of the enclosure 52 depends on the triaxial shield associated with the measurement instrumentation. However the enclosure 52 can alternatively be electrically biased by the selective connector mechanism 56, or interconnected with the outer enclosure 12 if desired for particular applications. In the normal situation where the inner enclosure 52 is not electrically connected to the outer enclosure 12, the outer shield components 12, 12a, 16a, 24a, and 30a protect the inner shield 52 from external noise sources, so that the inner shield in turn can minimize noise-induced spurious currents affecting the chuck elements 40 and/or 42 and thereby maximize the accuracy of the test measurements.

Movement of the chuck assembly 14 laterally by the X-axis and Y-axis positioners 16 and 24, respectively, is accomplished with the Z-axis positioner retracted in order to position the test device with respect to the probe or probes. During such movement, the environmental integrity of the inner enclosure 52 is maintained by means of an electrically conductive flexible wall assembly indicated generally as 58. The wall assembly 58 includes a pair of flexibly extensible and retractable pleated wall elements 58a which are extensible and retractable along the X-axis, and a further pair of such wall elements 58b which are flexibly extensible and retractable along the Y-axis. The outermost ends of the wall elements 58a are electrically connected to the inner surfaces of the inner enclosure 52 by screws (not shown). The innermost ends of the wall elements 58a are similarly connected to a rectangular metal frame 60 supported by the Y-axis positioner housing 24a by means of brackets 62 (FIG. 3) and dielectric spacers 64 which insulate the frame 60 from the Y-axis positioner housing 24a. The outermost ends of the flexible wall elements 58b, on the other hand, are electrically connected to the inner surfaces of the ends of the frame 60 by screws (not shown), while their innermost ends are similarly connected to respective conductive bars 66 insulatively supported by dielectric brackets 68 atop the Z-axis positioner housing 30a. Conductive plates 70 are electrically connected to the bars 66 and surround the chuck shield skirt 36a in spaced relation thereto.

As the X-axis positioner 16 moves the Y-axis positioner 24 and chuck assembly along the X-axis, it likewise moves the frame 60 and its enclosed wall elements 58b along the X-axis as the wall elements 58a extend and retract. Conversely, as the Y-axis positioner 24 moves the Z-axis positioner and chuck assembly along the Y-axis, the wall elements 58b similarly extend and retract along the Y-axis.

Figure 4:
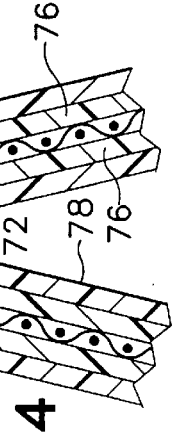
FIG. 4 is an enlarged sectional view of a portion of a flexible wall element of the embodiment of FIG. 1.

With reference to FIG. 4, a cross-section of an exemplary pleat 72 of the flexible wall elements 58a and 58b is shown. The electrically conductive core 74 of the pleated material is a fine mesh polyester, chemically coated with copper and nickel. The core 74 is sandwiched between respective layers 76 which are nylon fabric with a PVC stiffener. The respective layers 76 in turn are covered by respective outer layers 78 of polyurethane. The pleated material is preferably fluid-impervious and opaque so that the inner enclosure 52 can serve as a dry and/or dark environment control chamber, as well as an EMI shield. However, if the inner enclosure 52 were merely intended to serve as a shield, the pleated material need not be fluid-impervious or opaque. Conversely, if the inner enclosure 52 were intended to serve merely as an environment control chamber for dry and/or dark purposes, without EMI shielding, the pleated material's conductive core 74 could be eliminated. Also, alternative pleated materials of other compositions, such as thin, highly flexible stainless steel or other all-metal sheet material, could be used.

Figure 5:
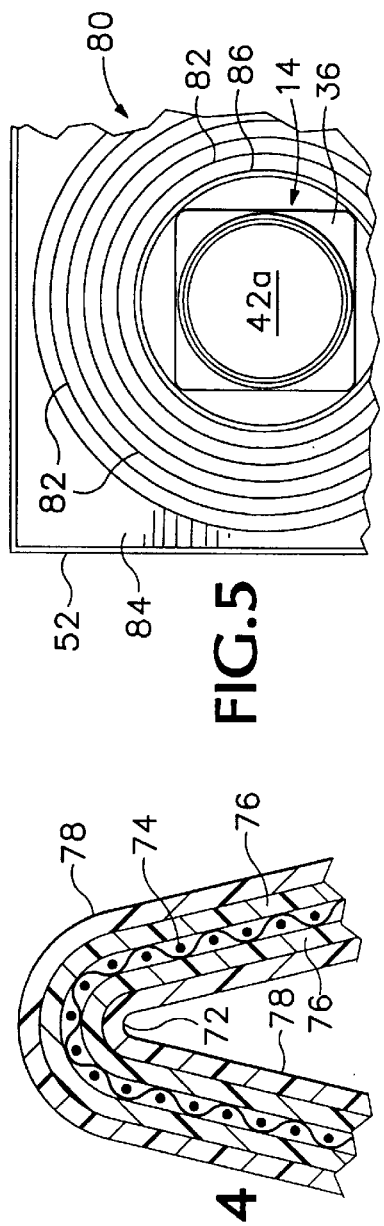
FIG. 5 is a partial top view of an alternative embodiment of the invention.

As a further alternative, a one-piece flexible wall assembly 80 (FIG. 5) having circular or oblate curved rings of pleats 82 surrounding the chuck assembly 14 could be provided in place of the wall assembly 58 to permit flexible extension and retraction in radial X and Y directions. The outer extremity of the wall assembly 80 is electrically connected by a curved conductive frame 84 to the inner shield enclosure 52. The inner extremity of the wall assembly 80 is supported by a circular conductive ring 86, and an underlying circular dielectric bracket (not shown) comparable to the bracket 68, upon the Z-axis positioner housing 30a.

As a further alternative, the inner enclosure 52 could utilize conductive or nonconductive sliding plates, such as those shown in U.S. Pat. No. 5,457,398 incorporated herein by reference, in place of the flexible wall assembly 58 if the more desirable characteristics of the flexible wall assembly are not needed. As a still further alternative, unpleated flexibly extensible and retractable material could be used instead of pleated material in the wall assembly 58.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

I claim:

1. A probe station for probing a test device, said probe station comprising:
   (a) a chuck assembly having a laterally extending supporting surface for supporting said test device during probing thereof;
   (b) an environment control enclosure substantially enclosing said supporting surface, said chuck assembly being laterally movable relative to said environment control enclosure;
   (c) said environment control enclosure including a flexible wall assembly interconnected with said chuck assembly, said wall assembly comprising flexibly extensible and retractable material having multiple laterally extending flexible pleats formed therein in laterally offset relation to said chuck assembly, said pleats extending along respective different lateral directions to enable said wall assembly to flexibly accommodate movement of said chuck assembly in multiple lateral directions perpendicular to each other.

2. The probe station of claim 1 wherein said pleats substantially surround said chuck assembly laterally.

3. The probe station of claim 1 wherein at least some of said pleats extend substantially linearly along respective different lateral directions perpendicular to each other.

4. The probe station of claim 1 wherein at least some of said pleats extend laterally in respective curved paths at least partially surrounding said chuck assembly laterally.

5. The probe station of claim 1 wherein at least major portions of said flexible wall assembly are composed of electrically conductive material.

6. The probe station of claim 1 wherein at least major portions of said flexible wall assembly are composed of fluid-impervious material.

7. The probe station of claim 1 wherein at least major portions of said flexible wall assembly are composed of opaque material.

8. A probe station for probing a test device, said probe station comprising:
   (a) a chuck assembly having a laterally extending supporting surface for supporting said test device during probing thereof;
   (b) an environment control enclosure substantially enclosing said supporting surface, said chuck assembly being laterally movable relative to said environment control enclosure;
   (c) said environment control enclosure including a flexible wall assembly interconnected with said chuck assembly, said wall assembly comprising at least a flexibly extensible and retractable first wall element and a flexibly extensible and retractable second wall element, each wall element being extensible and retractable independently of the other along a respective lateral flexing axis substantially perpendicular to that of the other, said second wall element being movable along a direction transverse to its respective lateral flexing axis in unison with the flexing of said first wall element along its respective lateral flexing axis.

9. The probe station of claim 8 wherein at least one of said first wall element and second wall element comprises a series of pleats.

10. The probe station of claim 8 where at least major portions of said first wall element and second wall element are composed of electrically conductive material.

11. The probe station of claim 8 wherein at least major portions of said first wall element and second wall element are composed of fluid-impervious material.

12. The probe station of claim 8 wherein at least major portions of said first wall element and second wall element are composed of opaque material.

13. The probe station of claim 8 wherein at least one of said first wall element and second wall element includes a pair of separate portions positioned along its respective lateral flexing axis on opposite sides of said chuck assembly.

14. The probe station of claim 13 wherein each of said first wall element and second wall element includes a respective pair of said separate portions.

15. The probe station of claim 8 wherein said second wall element is interconnected with said first wall element by a frame movable in unison with the flexing of said first wall element.

* * * * *